United States Patent [19]  [11] Patent Number: 4,967,075
Borden  [45] Date of Patent: Oct. 30, 1990

[54] VELOCITY MONITORING METHOD AND APPARATUS

[75] Inventor: Peter G. Borden, Palo Alto, Calif.

[73] Assignee: High Yield Technology, Mountain View, Calif.

[21] Appl. No.: 186,685

[22] Filed: Apr. 21, 1988

Related U.S. Application Data

[63] Continuation of Ser. No. 908,058, Sep. 16, 1986, abandoned.

[51] Int. Cl.⁵ .............................................. H01J 3/14
[52] U.S. Cl. ................................ 250/237 G; 324/175; 364/565
[58] Field of Search .......... 250/222.1, 231 SE, 237 G, 250/237 R; 324/173-175; 364/565; 33/125 A, 125 C

[56] References Cited

U.S. PATENT DOCUMENTS

| | | | |
|---|---|---|---|
| 3,708,681 | 1/1973 | Ivers | 250/237 G |
| 4,320,662 | 3/1982 | Schuab et al. | 364/565 |
| 4,338,518 | 7/1982 | Brienza et al. | 250/231 SE |
| 4,356,447 | 10/1982 | Hönig et al. | 364/565 |
| 4,403,859 | 9/1983 | Ernst | 250/237 G |
| 4,602,242 | 7/1986 | Kimura | 250/231 SE |
| 4,616,131 | 10/1986 | Burkhardt | 250/231 SE |

Primary Examiner—Edward P. Westin
Assistant Examiner—Khaled Shami
Attorney, Agent, or Firm—Skjerven, Morrill, MacPherson, Franklin & Friel

[57] ABSTRACT

A velocity measuring system useful for monitoring repetitive bidirectional movements of a carrier, which supports workpieces in production, initially stores the values of a number of velocities representative of normal operation to establish a normal velocity range, and then compares the values of subsequent carrier velocities to the normal range. A continuing deviation from the normal range is indicative of defective actuator operation, allowing repair or replacement prior to hard failure and serious disruption of the production line.

7 Claims, 1 Drawing Sheet

VELOCITY MONITORING METHOD AND APPARATUS

This application is a continuation of application Ser. No. 06/908,058, filed Sept. 16, 1986, now abandoned.

BACKGROUND OF THE INVENTION

1. Field of the Invention

This invention relates to a velocity monitoring method and means and in particular to a method and means for sensing variations in the velocity of moving parts.

2. Description of the Prior Art

During the manufacture of various products, such as semiconductor wafers for example, the processed parts or workpieces in process are generally moved from one station to another. Each workpiece is subjected to a particular process step during which the workpiece is moved at the station to be treated according to production specifications. The velocity of the moving workpieces from station to station, or from position to position at a given station, is invariant from workpiece to workpiece. However, in the event that the drive and transporting apparatus become defective or suffers from mechanical breakdown, then failure in the production process may occur with serious deleterious results. Therefore, it is highly desirable to be able to predict or anticipate degradation of the drive and transporting apparatus well in advance of actual breakdown so that a hard failure will not occur to disrupt the production process entirely. This is especially significant in high volume production of sensitive parts employing apparatus which operate under critical parameters, such as experienced in the production of semiconductor wafers.

SUMMARY

An object of this invention is to provide a method and means for monitoring the velocity of moving parts so that failure of the drive and transporting apparatus can be anticipated.

In accordance with this invention, a means for monitoring the velocity of moving workpieces which are sequentially processed comprises a carrier for supporting the workpieces, and means for sensing the velocity of the carrier during repetitive bidirectional movement along the same path. Initially, when the transport apparatus is known to be in good operating condition, the values of a specified number of measured velocities are stored in a data processor or minicomputer, and a normal range of velocities is established. Thereafter, the velocities of repeated movements of the carrier are monitored and compared to determine whether the velocities fall into the defined normal range.

BRIEF DESCRIPTION OF THE DRAWINGS

The invention will be described in greater detail with reference to the drawings in which.

DETAILED DESCRIPTION

Figure 1:
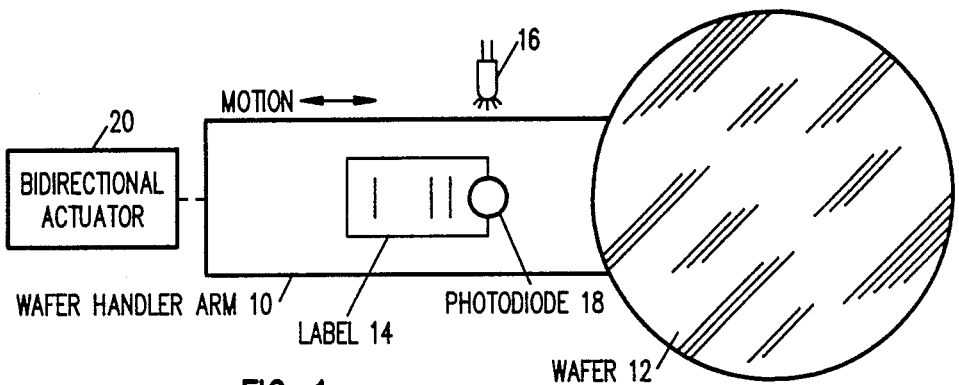
FIG. 1 is a plan view of a velocity monitoring system as applied to semiconductor wafer handling, in accordance with this invention.

With reference to FIG. 1, an apparatus for transporting semiconductor wafers that are being processed along a production line includes a carrier or support 10, which is preferably a rigid arm on which a semiconductor wafer 12 is mounted. The carrier arm is movable at a constant speed by a drive mechanism or actuator 20 to transport the wafer to a position at which it undergoes a process step, and then to retract the wafer to a home position from which it can be removed and transferred to another work station. Upon removal of the processed wafer, another wafer is then mounted to the carrier arm for similar handling. The wafers in production are mounted sequentially to the carrier arm for treatment at the station, at which one of a multiplicity of process steps is implemented.

In accordance with this invention, a label 14 having a plurality of spaced line markings or indicia is fixed to the arm 10. The label may be a simple, inexpensive plastic or paper attached with adhesive, or alternatively an engraved metal plate. At least three markings are imprinted on the label and are configured as fine parallel lines that are separated by different spacings. The lines are oriented so that when the carrier arm is moved, the lines are substantially orthogonal to the direction of travel. In this embodiment, three line markings are employed, with the first and second lines being closely spaced, and the second and third lines being spaced further apart. The surface of the label is dark and non-reflecting whereas the markings are light reflecting.

A photosensing system comprises a light emitting device 16 that provides illumination and a photosensor or photodiode 18 that receives the reflected light from the label. The photodiode is disposed closely adjacent to the wafer carrier 10 and the indicator label 14. When the carrier and the wafer are moved at a constant velocity by an actuating mechanism 20, such as a constant speed bidirectional drive motor, the passage of the reflecting markings relative to the fixed photosensor 18 is detected and a pulse signal is generated in response to each marking. The spacing between the lines is such that the photosensor generates a discrete pulse signal for each line that is sensed.

The pulse signals are directed to a data processor or a minicomputer 22 (See FIG. 2), which stores the values of the time differences or periods between pulses. The processor 22 computes and stores the values of the first period or time $t_1$, representing the velocity of movement of the wafer carrier 10 in the forward direction, as measured between the closely spaced first and second lines: and the second period or time $t_2$ representing the velocity in the forward B direction between the further spaced second and third lines. The processor also computes and stores the values of the times $t_3$ and $t_4$ derived from the pulses generated when the direction of travel of the carrier and wafer is reversed, after the wafer has been processed at the station and returned to home position. It is apparent that the values of the computed periods $t_3$ and $t_4$, respectively. differ from the values of the periods $t_1$ and $t_2$ since the unequal spacings are reversed in order. Also, when the carrier is transported in the reverse direction, the hysteresis factor introduced by the reversal causes a variation in the velocity of the carrier. In this way, the motion of the carrier is monitored on a continual basis as it moves one wafer after the other to and from the work station, and the values of the time periods representative of the velocities for each cycle of the carrier arm are stored in the memory.

Figure 3:
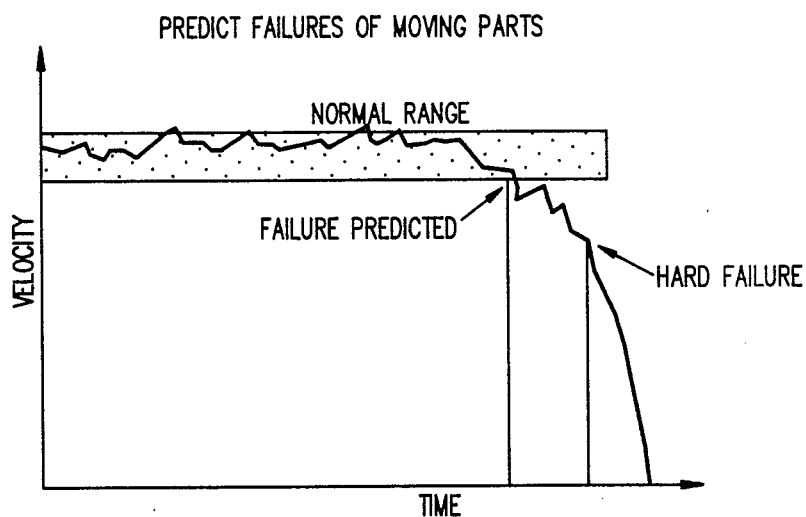
FIG. 3 is a plot of velocity versus time illustrating a normal range of velocities and subsequent variations in the velocities of moving parts, indicating the likelihood of failure of normal operation.

It has been observed that the measured velocities fluctuate within a narrow band over a period of time, as illustrated in FIG. 3. In keeping with this invention, during the early use of the actuating mechanism and when it is in good operating order, a predetermined number of carrier bidirectional movements are monitored and representative values of the velocities are stored. The data processor 22 computes and determines a normal range with outer limits of velocities for which bidirectional movement of the carrier is deemed to be normal operation. Thereafter, for subsequent movements of the carrier between home position and the work position, the recorded time values representative of the velocities of the carrier are compared to determine whether there is any significant deviation from the normal range. In the event that the measured velocities appear to deviate from the normal range, and consistently fall outside the normal velocity range, the data processor provides a warning indication of such variation. The indication may be an audio signal or visual display, by way of example.

When the operating mechanism begins to misfunction, the velocity gradually drops out of the normal velocity range, at first slowly, then rapidly. A rapid drop in velocity corresponds to hard failure. The operator or inspector is able to detect that the variations have exceeded the limits of the normal range and that the actuator or other elements require repair or replacement in order to prevent hard failure.

Figure 2:
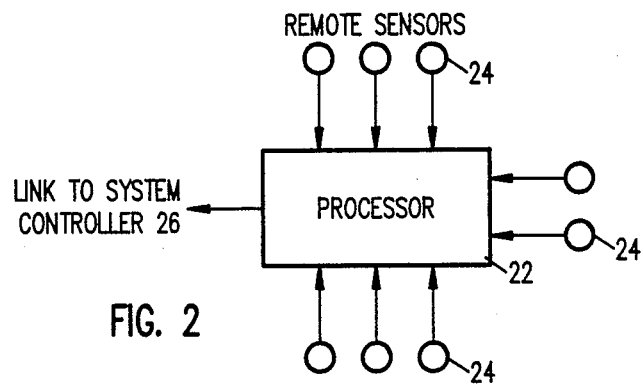
FIG. 2 is a representational diagram of a velocity monitoring system for sensing, storing and comparing velocities of parts that are moved between or at a plurality of work stations.

In an implementation of this invention, a single microcomputer 22 is dedicated to a number of velocity sensors 24, as illustrated in FIG. 2. As it is common to have a number of parts moving simultaneously at different work stations in a production line, each of the parts can be monitored with a separate sensing device to generate pulse signals at each work station to be transmitted to the data processor. The processor or microcomputer is coupled to a host controller 26 that initiates the warning signal when a hard failure is predicted.

It should be understood that the invention is not limited to the specific embodiment disclosed above. For example, the type, the number and the spacing of indicia can be varied. For example, the label and the carrier portion to which it is mounted can be made transparent with opaque line indicators, or conversely the label can be made opaque with transparent lines. In such case the light source is located at one surface of the carrier and the photosensor at the other surface in alignment with the light source. Also, the carrier arm can be movable in an arcuate path, with the markings arranged to follow the path so that the generated pulses represent the velocity of the carrier arm as it pivots.

What is claimed is:

1. A method of monitoring the velocities of a carrier that is movable repetitively and bidirectionally, and wherein said carrier incorporates a plurality of markings that are unequally spaced comprising the steps of:

sensing the times between the passage of consecutive markings as said carrier is moved between two positions;

recording values representative of the velocities of said carrier during a plurality of cycles of motion, said values representing the sensed times and the distances between consecutive markings:

determining a normal range of velocities when said carrier and its actuator are functioning properly:

comparing the recorded values representing measured velocities to values representing said normal range of velocities: and providing a warning signal when said measured velocities differ significantly from said normal range of velocities.

2. A system for monitoring the velocity of a movable carrier on which an article to be processed is seated as it travels bidirectionally and repetitively between two fixed positions comprising:

means for actuating said carrier to move at a substantially constant speed bidirectionally and repetitively in a linear path between said two positions;

indicator means fixedly attached to said carrier, said indicator means having a pattern of irregularly spaced linear markings disposed in parallel relation, said parallel linear markings being substantially orthogonal to the direction of travel of said carrier;

optical sensing means disposed adjacent to said indicator means for sensing the passage of said spaced markings as said carrier is moved bidirectionally between said two positions and for generating signals in response to sensed spaced markings, said generated signals being representative of the direction of travel and the speed of said carrier in the forward and reverse directions as it moves bidirectionally over a number of cycles in a linear path between said two positions; and a data processing system for receiving and storing said generated signals and for providing an indication when the speed of said carrier deviates from a predetermined normal range of speeds in the forward or reverse direction.

3. A system as in claim 2, wherein said markings constitute a pattern of at least three parallel lines that are spaced unequally, said lines being substantially perpendicular to the direction of travel of said carrier.

4. A system as in claim 3, wherein said sensing means comprises a light emitting diode for illuminating the surface of said label or plate, and a photosensor for sensing light reflected from said label or plate and for generating a pulse when a line is sensed.

5. A system as in claim 2, wherein said carrier is actuated to move in a linear or arcuate direction.

6. A system as in claim 2, wherein said sensing means includes a plurality of photosensors, said photosensors being coupled to associated movable carriers, and wherein said data processing system comprises a single processor to which said plurality of photosensors are coupled to provide pulses representative of the velocities of said associated movable carriers.

7. A system as in claim 2, wherein said indicator means comprises a single array of a plurality of markings.

* * * * *